United States Patent
Maruyama

(10) Patent No.: US 10,241,531 B1
(45) Date of Patent: Mar. 26, 2019

(54) POWER SUPPLY DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Tatsuhiko Maruyama, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/923,124

(22) Filed: Mar. 16, 2018

(30) Foreign Application Priority Data

Sep. 26, 2017 (JP) ................................. 2017-185336

(51) Int. Cl.
| | |
|---|---|
| H02M 1/36 | (2007.01) |
| H02M 3/157 | (2006.01) |
| G05F 1/595 | (2006.01) |
| G05F 1/575 | (2006.01) |
| H03K 5/01 | (2006.01) |
| H03K 5/24 | (2006.01) |
| H03K 5/00 | (2006.01) |

(52) U.S. Cl.
CPC .............. *G05F 1/595* (2013.01); *G05F 1/575* (2013.01); *H03K 5/01* (2013.01); *H03K 5/24* (2013.01); *H03K 2005/00013* (2013.01)

(58) Field of Classification Search
CPC ............. H02M 1/38; H02M 2001/385; H02M 2001/0012; H02M 3/156; H02M 3/157; H02M 3/158; H02M 3/1588; H02M 1/36
See application file for complete search history.

(56) References Cited

U.S. PATENT DOCUMENTS

| | | | | |
|---|---|---|---|---|
| 8,237,421 B1* | 8/2012 | Shahani | ................ | H02M 3/156 323/282 |
| 8,669,748 B2 | 3/2014 | Ishii | | |
| 2013/0241512 A1* | 9/2013 | Yamada | .................... | G05F 1/10 323/283 |
| 2014/0103896 A1* | 4/2014 | Lee | ........................ | H02M 3/158 323/282 |

FOREIGN PATENT DOCUMENTS

| | | |
|---|---|---|
| JP | 2003-088105 A | 3/2003 |
| JP | 2010-035302 A | 2/2010 |
| JP | 2012-090387 A | 5/2012 |

* cited by examiner

*Primary Examiner* — Gary L Laxton
(74) *Attorney, Agent, or Firm* — White & Case LLP

(57) ABSTRACT

According to an embodiment of the present invention, a power supply device includes a switching circuit, a detection circuit, a first comparator, a current source circuit, and a delay circuit. The switching circuit performs switching control of a power supply voltage. The detection circuit detects an output voltage from the switching circuit. The first comparator compares the voltage detected by the detection circuit with a first reference voltage which is set in advance. The current source circuit outputs a bias current which has correlation with the power supply voltage. The delay circuit receives the bias current from the current source circuit, and outputs, to the switching circuit, a delay time which corresponds to an increase time of the output voltage, by using the bias current in accordance with the result of comparison performed by the first comparator.

8 Claims, 4 Drawing Sheets

POWER SUPPLY DEVICE

CROSS-REFERENCE TO RELATED APPLICATIONS

This application is based upon and claims the benefit of priority from Japanese Patent Application No. 2017-185336, filed on Sep. 26, 2017; the entire contents of which are incorporated herein by reference.

FIELD

An embodiment of the present invention relates to a power supply device.

BACKGROUND

For example, a non-linear control system is used for a power supply device such as a DC-DC converter. The non-linear control system is characterized in that the operation frequency fluctuates depending on a power supply voltage while the circuit configuration is simple and the response speed is high.

DETAILED DESCRIPTION

Embodiments will now be explained with reference to the accompanying drawings. The present invention is not limited to the embodiments.

First Embodiment

Figure 1:
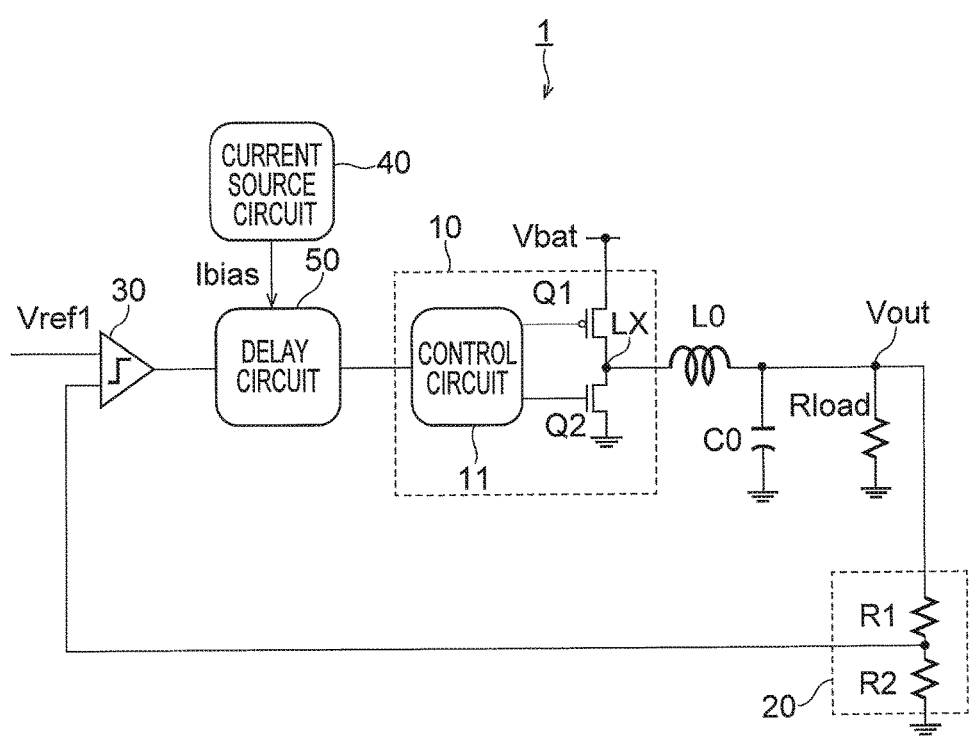
FIG. 1 is a block diagram illustrating the schematic circuit configuration of a power supply device according to a first embodiment.

FIG. 1 is a block diagram illustrating the schematic circuit configuration of a power supply device according to a first embodiment. As illustrated in FIG. 1, a power supply device 1 according to the present embodiment includes a switching circuit 10, a detection circuit 20, a comparator 30 (a first comparator), a current source circuit 40, and a delay circuit 50.

The switching circuit 10 includes a switching element "Q1", a switching element "Q2", and a control circuit 11. The switching element "Q1" is a P-channel MOS (metal oxide semiconductor) transistor. The switching element "Q2" is an N-channel MOS transistor.

The source of the switching element "Q1" is connected to a power supply such as a battery. The source of the switching element "Q2" is grounded. The drains of the switching elements are connected to a connection terminal "LX" which is an output node of the switching circuit 10. The gates of the switching elements are connected to the control circuit 11. A resistance load "Rload" is externally connected to the connection terminal "LX" via an inductor "L0". A capacitor "C0" is externally connected between the inductor "L0" and the resistance load "Rload".

In the switching circuit 10, the control circuit 11 turns on the switching elements alternately. Accordingly, a power supply voltage "Vbat" is subjected to switching control and is outputted through the connection terminal "LX". This voltage is supplied to the resistance load "Rload" via the inductor "L0".

The detection circuit 20 includes a resistance element "R1" and a resistance element "R2" which are connected in series. By using the resistance element "R1" and the resistance element "R2", the detection circuit 20 divides an output voltage "Vout" from the switching circuit 10, that is, a voltage supplied from the resistance load "Rload". As a detected voltage, the divided voltage is inputted to the comparator 30.

The comparator 30 compares the voltage detected by the detection circuit 20 with a reference voltage "Vref1" (a first reference voltage) which is set in advance. The current source circuit 40 outputs a bias current "Ibias" to the delay circuit 50. The delay circuit 50 outputs a delay time to the control circuit 11 by using the bias current "Ibias" in accordance with the result of comparison performed by the comparator 30. Here, the configuration of the current source circuit 40 and the delay circuit 50 is described with reference to FIG. 2.

Figure 2:
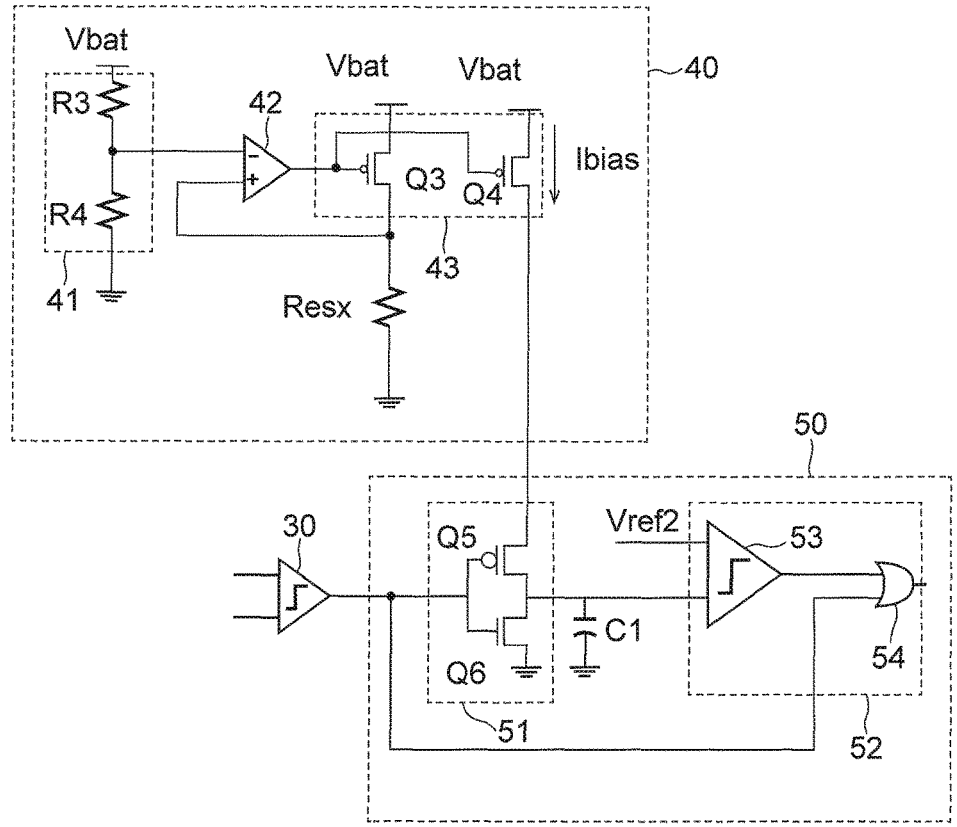
FIG. 2 is a block diagram illustrating the configuration of a current source circuit and a delay circuit.

FIG. 2 is a block diagram illustrating the configuration of the current source circuit 40 and the delay circuit 50. First, a description of the current source circuit 40 is given.

The current source circuit 40 includes a voltage division circuit 41, an operational amplifier 42, a current mirror circuit 43, and a resistance element "Resx". The voltage division circuit 41 includes a resistance element "R3" and a resistance element "R4" which are connected in series. The voltage division circuit 41 divides the power supply voltage "Vbat" by using the resistance element "R3" and the resistance element "R4".

The operational amplifier 42 amplifies the difference between an output voltage from the voltage division circuit 41 and a voltage applied to both ends of the resistance element "Resx", and outputs the resultant voltage to each of the gates of transistor "Q3" and the transistor "Q4" of the current mirror circuit 43. Each of the transistor "Q3" and the transistor "Q4" is a P-channel MOS transistor, for example.

The gates of the transistors are connected to an output terminal of the operational amplifier 42. Each of the potentials of the sources of the transistors is the power supply voltage "Vbat". The drain of the transistor "Q3" is grounded via the resistance element "Resx". Since the inputs of the operational amplifier 42 are in a virtual short, a voltage obtained by diving the power supply voltage "Vbat" is applied to the drain of the transistor "Q"3. The drain of the transistor "Q4" is connected to the delay circuit 50.

The operational amplifier 42 operates such that the output voltage from the voltage division circuit 41 and the voltage applied to both ends of the resistance element "Resx" are equal to each other (are in an equilibrium state), and the transistor "Q3" and the transistor "Q4" perform analog operation in the saturation region. During this operation, a current is caused to flow through the transistor "Q3", and is mirrored to the transistor "Q4". As a result, a current flowing through the transistor "Q4" is supplied as the bias current "Ibias" to the delay circuit 50. The value of the bias current "Ibias" depends on the resistance element "Resx". Therefore, the resistance element "Resx" serves as a current setting element for setting the value of the bias current "Ibias".

Next, a description of the delay circuit 50 is given. The delay circuit 50 includes an inverter circuit 51, an adjustment circuit 52, and a capacitor "C1". The inverter circuit 51 includes a transistor "Q5" and a transistor "Q6". The transistor "Q5" is a P-channel MOS transistor. The transistor "Q6" is an N-channel MOS transistor.

The gates of the transistors are connected to an output terminal of the comparator 30. The drains of the transistors are connected to each other. The source of the transistor "Q5" is connected to the drain of the transistor "Q4" of the current source circuit 40. The source of the transistor "Q6" is grounded.

One end of the capacitor "C1" is connected to the drains of the transistors "Q5", "Q6", that is, the output side of the inverter circuit 51. The other end of the capacitor "C1" is grounded. The capacitor "C1" is changed with the bias current "Ibias" supplied from the current source circuit 40.

The adjustment circuit 52 includes a comparator 53 (a second comparator) and an OR circuit 54. The comparator 53 compares the charged voltage in the capacitor "C1" with a reference voltage "Vref2" (a second reference voltage) which is set in advance. The output level of the OR circuit 54 is switched in accordance with the result of comparison performed by the comparator 53. For example, when the charged voltage in the capacitor "C1" is lower than the reference voltage "Vref2", the output level of the OR circuit 54 is high.

In the delay circuit 50, charging of the capacitor "C1" is started when the transistor "Q5" is turned on and the transistor "Q6" is turned off. Thereafter, a time taken for the charged voltage in the capacitor "C1" to be increased to the reference voltage "Vref2" is outputted as a delay time from the OR circuit 54. The delay time can be adjusted by variation of the value of the reference voltage "Vref2".

Figure 3:
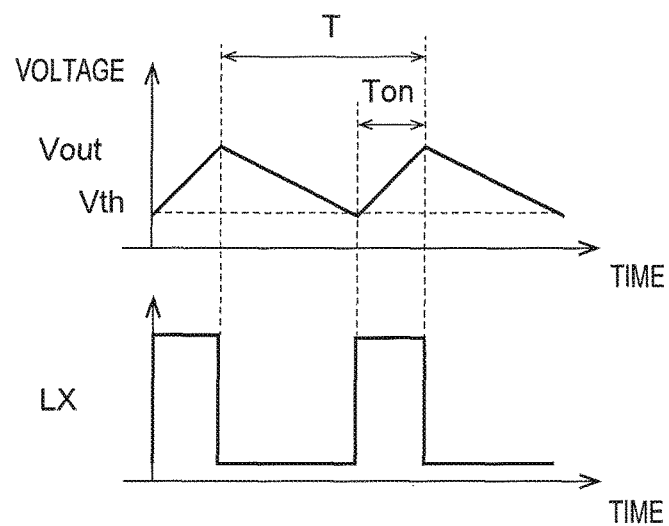
FIG. 3 shows a waveform chart of an output voltage "Vout" from a switching circuit and a waveform chart of the voltage of a connection terminal "LX"

FIG. 3 shows a waveform chart of the output voltage "Vout" from the switching circuit 10 and a waveform chart of the voltage of the connection terminal "LX". As shown in FIG. 3, when the output voltage "Vout" becomes lower than a threshold voltage Vth (="Vref1"×("R1"+"R2")/"R2"), the delay circuit 50 outputs a delay time "Ton" to the control circuit 11.

Until the delay time "Ton" has elapsed, the control circuit 11 keeps the switching element "Q1" on and keeps the switching element "Q2" off. As a result, the voltage level of the connection terminal "LX" becomes high and the output voltage "Vout" is increased.

After the delay time "Ton" has elapsed, the control circuit 11 turns off the switching element "Q1" and turns on the switching element "Q2". As a result, the voltage of the connection terminal "LX" becomes low and the output voltage "Vout" is decreased. In this way, increase and decrease of the output voltage "Vout" are repeated.

In FIG. 3, a time "T" between the peak voltages of the output voltage "Vout" corresponds to the operation cycle of the switching circuit 10. That is, the inverse of the time "T" corresponds to the operation frequency "F" of the switching circuit 10. The operation frequency "F" is expressed by the following expression (1) using the power supply voltage "Vbat", the output voltage "Vout", and the delay time "Ton".

$$F = \frac{Vout}{Vbat} \times \frac{1}{Ton} \quad (1)$$

The delay time "Ton" is expressed by the following expression (2) using the reference voltage "Vref2", the capacitor "C1", and the bias current "Ibias".

$$Ton = Vref2 \times \frac{C1}{Ibias} \quad (2)$$

When the expression (2) is substituted into the expression (1), the operation frequency "F" is expressed by the following expression (3).

$$F = \frac{Vout}{Vbat} \times \frac{Ibias}{Vref2 \times C1} \quad (3)$$

In the power supply device 1, the output voltage "Vout" is controlled to be constant. Therefore, the output voltage "Vout", the reference voltage "Vref2", and the capacitor "C1" are constant in the expression (3). If the bias current "Ibias" is constant, the delay time "Ton" is fixed so that the operation frequency "F" depends on the power supply voltage "Vbat". In this case, when the power supply voltage "Vbat" fluctuates, the operation frequency "F" follows the voltage fluctuation.

When the power supply device 1 is used for a wireless communication apparatus, for example, fluctuation of the operation frequency "F" may have an influence on noise, etc. Therefore, in this use, fluctuation of the operation frequency "F" is desired to be suppressed.

Thus, in the present embodiment, the bias current "Ibias" is defined by the following expression (4) using a voltage division ratio α at the voltage division circuit 41, the power supply voltage "Vbat", and the resistance element "Resx".

$$Ibias = \frac{\alpha \times Vbat}{Resx} \quad (4)$$

When the expression (4) is substituted into the expression (3), the operation frequency "F" is expressed by the following expression (5).

$$F = \frac{\alpha}{C1 \times Resx} \quad (5)$$

The expression (5) does not include the power supply voltage "Vbat". Accordingly, the operation frequency "F" is free from an influence of the power supply voltage "Vbat".

According to the present embodiment having been described above, the bias current "Ibias" has correlation with the power supply voltage "Vbat" in the current source circuit 40. Consequently, any influence of the power supply voltage "Vbat" is eliminated from the operation frequency "F" of the switching circuit 10 so that fluctuation of the operation frequency "F" can be suppressed.

Second Embodiment

Figure 4:
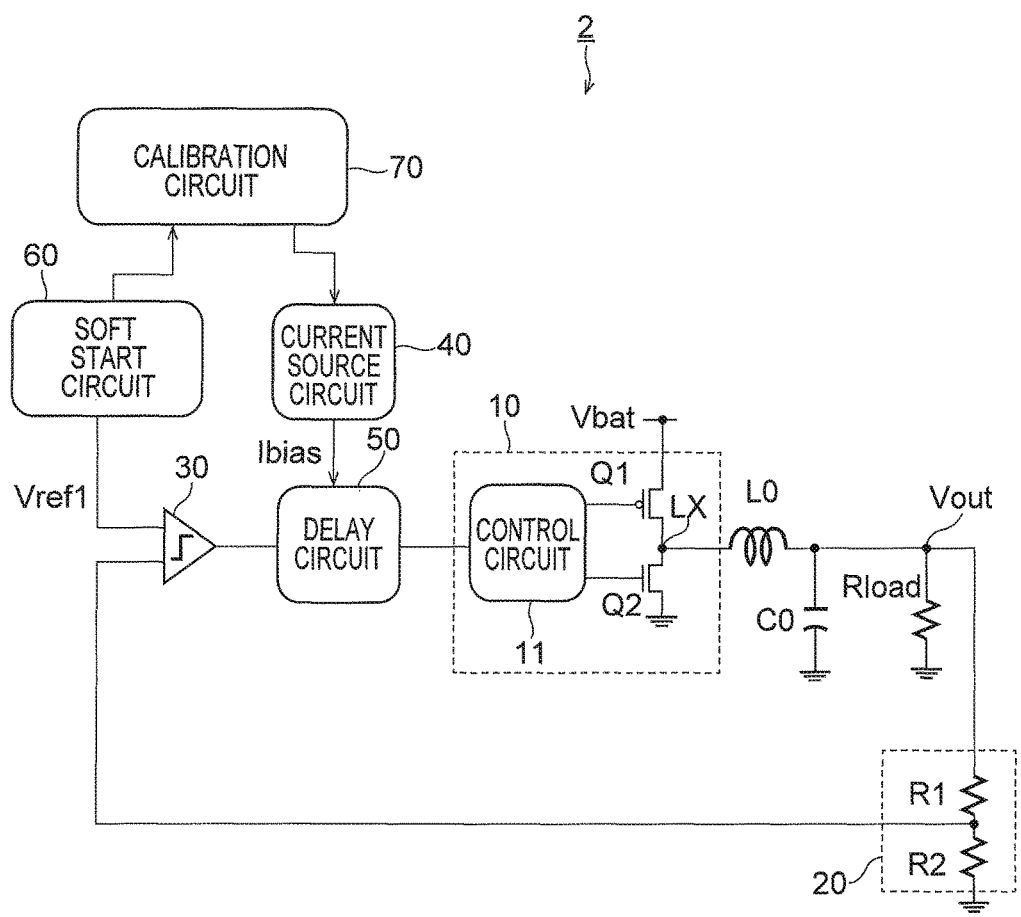
FIG. 4 is a block diagram illustrating the schematic circuit configuration of a power supply device according to a second embodiment.

Hereinafter, a second embodiment is described. FIG. 4 is a block diagram illustrating the schematic circuit configuration of a power supply device according to the second embodiment. Components identical to those of the power supply device 1 illustrated in FIG. 1 are denoted by the same reference numbers and a detailed explanation thereof is omitted.

A power supply device 2 according to the present embodiment includes a soft start circuit 60 and a calibration circuit 70 in addition to the aforementioned components of the power supply device 1. The soft start circuit 60 controls a rising time of the reference voltage "Vref1" that is inputted to the comparator 30. The calibration circuit 70 calibrates the bias current "Ibias" in accordance with the rising time of the reference voltage "Vref1".

Figure 5:
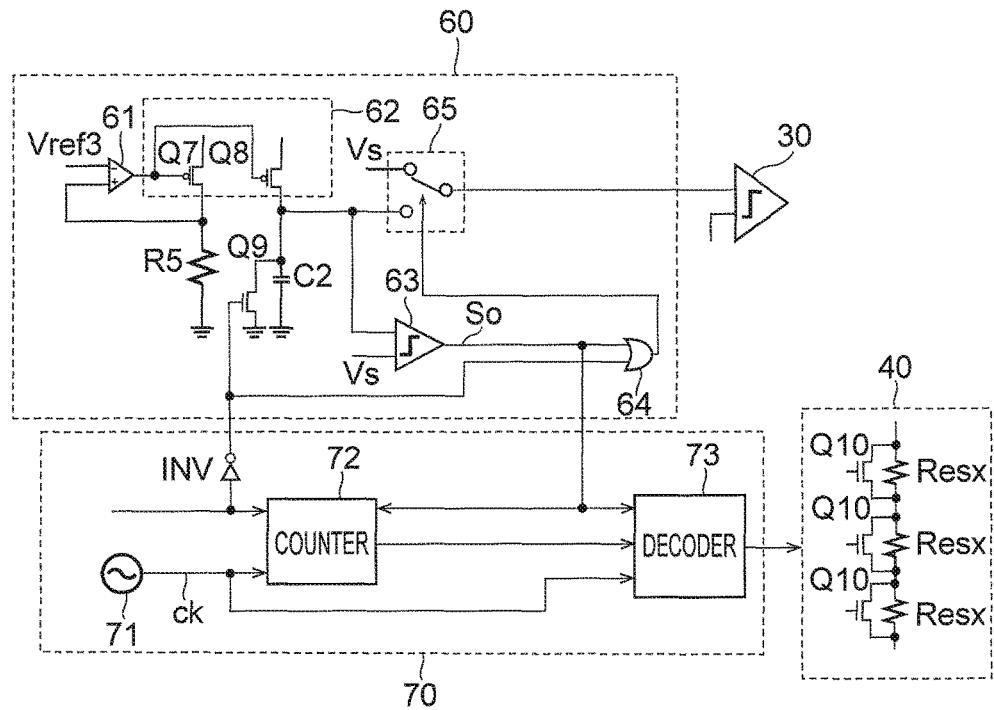
FIG. 5 is a block diagram illustrating the configuration of a soft start circuit and a calibration circuit.

FIG. 5 is a block diagram illustrating the configuration of the soft start circuit 60 and the calibration circuit 70. First, a description of the soft start circuit 60 is given.

The soft start circuit 60 includes an operational amplifier 61, a current mirror circuit 62, a comparator 63, an OR circuit 64, a switch 65, a resistance element R5, a capacitor "C2", and a transistor "Q9".

The operational amplifier 61 amplifies the difference between a voltage applied to both ends of the resistance element "R5" and a reference voltage "Vref3" which is set in advance, and outputs the resultant voltage to each of the gates of a transistor "Q7" and a transistor "Q8" of the current mirror circuit 62. The reference voltage "Vref3" can be set to 1.2 V, for example. Each of the transistor "Q7" and the transistor "Q8" is a P-channel MOS transistor, for example.

The gates of the transistors are connected to an output terminal of the operational amplifier 61. Each of the potentials of the sources of the transistors is the power supply voltage "Vbat". The drain of the transistor "Q7" is grounded via the resistance element R5. The drain of the transistor "Q8" is grounded via the capacitor "C2".

The transistor "Q9" is connected in parallel with the capacitor "C2". The transistor "Q9" is an N-channel MOS transistor which operates under the control by the calibration circuit 70.

The operational amplifier 61 operates such that the reference voltage "Vref3" and the voltage applied to both ends of the resistance element R5 are equal to each other (are in an equilibrium state), and the transistors "Q7", "Q8" perform analog operation in the saturation region. During this operation, a current ("Vref3"/"R5") is caused to flow through the transistor "Q7", and is mirrored to the transistor "Q8". Further, the transistor "Q9" is off. As a result, the capacitor "C2" is charged with the current flowing through the transistor "Q8". The value of a current to be charged in the capacitor "C2" can be set through the resistance element "R5".

By the comparator 63, the charged voltage in the capacitor "C2" is compared with a steady-state voltage "Vs" which is set in advance. The steady-state voltage "Vs" can be set to 1 V, for example. The output level of the OR circuit 64 is switched according to the result of comparison performed by the comparator 63. According to switching of the output level, the switch 65 is also switched.

Figure 6:
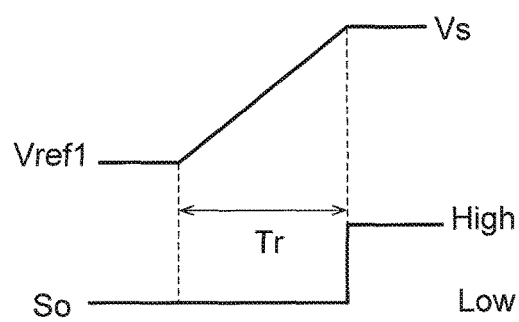
FIG. 6 shows a rise of a reference voltage "Vref1".

FIG. 6 shows a rise of the reference voltage "Vref1". Until the capacitor "C2" is charged to the steady-state voltage "Vs", an output signal So from the comparator 63 is in a low level. Here, the capacitor "C2" and the comparator 30 are connected to each other by the switch 65. Accordingly, a rising time "Tr" of the reference voltage "Vref1" corresponds to a charge time of the capacitor "C2". The rising time "Tr" can be set to 100 for example.

When the capacitor "C2" is charged to the steady-state voltage "Vs", the output signal So from the comparator 63 is switched from the low level to the high level. Consequently, the output level of the OR circuit 64 is also switched so that the switch 65 is switched as illustrated in FIG. 5. As a result, the reference voltage "Vref1" is kept at the steady-state voltage "Vs". Rush current can be avoided by such a slow rise of the reference voltage "Vref1" at the soft start circuit 60.

As shown in expressions (3) to (5) having been described in the first embodiment, the operation frequency "F" of the switching circuit 10 depends on the resistance elements "Resx" of the current source circuit 40 and the capacitor "C1" of the delay circuit 50. Also, the bias current "Ibias" depends on the resistance elements "Resx". Therefore, the electric characteristics of the resistance elements "Resx" and the capacitor "C1" have an influence on the operation frequency "F" and the bias current "Ibias", but these electric characteristics may vary depending on the manufacturing steps or the usage environment.

For this reason, in the present embodiment, the calibration circuit 70 calibrates the resistance elements "Resx" by using an element of the soft start circuit 60 which is formed on the same semiconductor chip on which the current source circuit 40 and the delay circuit 50 are formed. A description of the calibration circuit 70 is given below.

As illustrated in FIG. 5, the calibration circuit 70 includes an oscillator 71, a counter 72, a decoder 73, and an inverter "INV". The oscillator 71 outputs a clock signal "ck" to the counter 72 and the decoder 73. Accordingly, the counter 72 and the decoder 73 can be synchronized with each other.

When receiving a start signal for indicating a counting start from the outside, the counter 72 resets a measurement value. Further, the start signal is inverted by the inverter "INV" and inputted to the gate of the transistor "Q9" of the soft start circuit 60. As a result, the transistor "Q9" is turned off and charging of the capacitor "C2" is started. During the increase of the voltage of the capacitor "C2", the counter 72 measures a time by using the output signal So from the comparator 63 of the soft start circuit 60.

When the voltage of the capacitor "C2" has been increased to the steady-state voltage "Vs", the level of the output signal So is switched. This stops the counter 72 performing the measurement. The result of measurement performed by the counter 72 is inputted to the decoder 73. The result of measurement corresponds to a time taken to charge the capacitor "C2" to the steady-state voltage "Vs", that is, the rising time "Tr" of the reference voltage "Vref1".

The decoder 73 decodes the result of measurement performed by the counter 72, to a control signal for adjusting the bias current "Ibias". The control signal is inputted to the current source circuit 40. Note that the decoder 73 may be provided with a flip-flop for temporarily storing the result of measurement performed by the counter 72.

In the current source circuit 40 of the present embodiment, a plurality of the resistance elements "Resx" are connected in series, as illustrated in FIG. 5. Further, respective transistors "Q10" are connected in parallel with the resistance elements "Resx". The transistors "Q10" are N-channel MOS transistors. The transistors "Q10" are turned on or off according to the control signal inputted from the decoder 73.

When the number of the transistors "Q10" in an off state is increased, the entire resistance value of the resistance elements "Resx" becomes great. As a result, the bias current "Ibias" becomes small. In contrast, when the number of the transistors "Q10" in an on state is increased, the entire resistance value of the resistance elements "Resx" becomes small. As a result, the bias current "Ibias" becomes large. The bias current "Ibias" can be calibrated by such control of the transistors "Q10" with the control signal.

According to the present embodiment having been described above, the bias current "Ibias" is calibrated by the calibration circuit 70. Accordingly, fluctuation of the operation frequency "F" can be further suppressed.

In addition, the calibration circuit 70 of the present embodiment is realized so as to have a relatively simple configuration. Therefore, upsizing of the device can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A power supply device comprising:
   a switching circuit to perform switching control of a power supply voltage;
   a detection circuit to detect an output voltage from the switching circuit;
   a first comparator to compare the voltage detected by the detection circuit with a first reference voltage which is set in advance;
   a current source circuit to output a bias current which has correlation with the power supply voltage; and
   a delay circuit to receive the bias current from the current source circuit, and to output, to the switching circuit, a delay time which corresponds to an increase time of the output voltage, by using the bias current in accordance with a result of comparison performed by the first comparator, wherein the current source circuit includes
   a voltage division circuit to divide the power supply voltage;
   a current setting element to set the value of the bias current;
   an operational amplifier to operate such that an output voltage from the voltage division circuit is equal to a voltage applied to both ends of the current setting element; and
   a current mirror circuit to output the bias current to the delay circuit in accordance with a result of an output from the operational amplifier.

2. The power supply device according to claim 1, wherein the delay circuit includes
   a capacitor to be charged with the bias current, and
   an adjustment circuit to adjust the delay time in accordance with the charged voltage in the capacitor.

3. The power supply device according to claim 2, wherein the adjustment circuit includes
   a second comparator to compare the charged voltage with a second reference voltage which is set in advance, and
   an OR circuit the output level of which is switched in accordance with a result of comparison performed by the second comparator.

4. A power supply device, comprising:
   a switching circuit to perform switching control of a power supply voltage;
   a detection circuit to detect an output voltage from the switching circuit;
   a first comparator to compare the voltage detected by the detection circuit with a first reference voltage which is set in advance;
   a current source circuit to output a bias current which has correlation with the power supply voltage;
   a delay circuit to receive the bias current from the current source circuit, and to output, to the switching circuit, a delay time which corresponds to an increase time of the output voltage, by using the bias current in accordance with a result of comparison performed by the first comparator;
   a soft start circuit to control a rising time of the first reference voltage; and
   a calibration circuit to calibrate the bias current in accordance with the rising time.

5. The power supply device according to claim 4, wherein the calibration circuit includes
   a counter to measure the rising time, and
   a decoder to decode a result of measurement performed by the counter, to a control signal for adjusting the bias current, and to output the control signal to the current source circuit.

6. The power supply device according to claim 5, wherein the calibration circuit further includes an oscillator to output a clock signal to the counter and the decoder.

7. The power supply device according to claim 4, wherein the soft start circuit, the current source circuit, and the delay circuit are provided on the same semiconductor chip.

8. The power supply device according to claim 5, wherein the current source circuit includes a plurality of resistance elements which are connected in series, and a plurality of transistors which are connected respectively in parallel with the plurality of resistance elements and which operate in accordance with the control signal.

* * * * *